United States Patent [19]

Pharris

[11] Patent Number: 5,577,054

[45] Date of Patent: Nov. 19, 1996

[54] DEVICE AND METHOD FOR PERFORMING ERROR DETECTION ON AN INTERLEAVED SIGNAL PORTION, AND A RECEIVER AND DECODING METHOD EMPLOYING SUCH ERROR DETECTION

[75] Inventor: Kenton J. Pharris, Elbert, Colo.

[73] Assignee: Philips Electronics North America Corporation, New York, N.Y.

[21] Appl. No.: 305,114

[22] Filed: Sep. 13, 1994

[51] Int. Cl.$^6$ .............................. H03M 13/00; H04N 5/78
[52] U.S. Cl. ........................ 371/39.1; 371/37.4; 371/37.7; 386/116
[58] Field of Search ................................... 371/39.1, 37.4, 371/37.5, 38.1, 40.3; 360/38.1

[56] References Cited

U.S. PATENT DOCUMENTS

| | | | |
|---|---|---|---|
| 4,206,440 | 6/1980 | Doi et al. | 371/37.7 |
| 4,306,305 | 12/1981 | Doi et al. | 371/37.4 |
| 4,451,920 | 5/1984 | Hoshimi et al. | 371/37.4 |
| 4,453,250 | 6/1984 | Hoshimi et al. | 371/37.4 |
| 4,459,696 | 7/1984 | Kojima | 371/40.3 |

OTHER PUBLICATIONS

Error–Correction Coding for Digital Communications by G. C. Clark, Jr. & J. B. Cain, Sec. 8.3 Interleaver Structures for Coded Systems, p. 345, 1988 Plenum Press, New York and London.
Error–Correcting Codes, W. W. Peterson and E. J. Weldon, Jr., 1.1–1.3, pp. 1–5 and Sec. 11–11.3, pp. 357–370, 1972, the Massachusetts Institute of Technology, MA.

Primary Examiner—Roy N. Envall, Jr.
Assistant Examiner—Emmanuel L. Moise
Attorney, Agent, or Firm—Richard A. Weiss

[57] ABSTRACT

An error detector and method for performing error detection on an interleaved signal portion including n successive data bytes made up of information data bytes and at least one error detection data byte, and a receiver and decoding method employing such error detection. The error detector operates to produce a syndrome indicating whether an error is detected in the interleaved signal portion. The syndrome which is generated is the same syndrome which would be generated by a prior art error detector performing error detection on a corresponding de-interleaved signal portion produced by de-interleaving the interleaved signal portion. The error detector and the method employed by it operate by: (a) deriving m steams of successive data bytes from the n data bytes being received in successive groups of m or less data bytes each (m indicating the number of data byte interleaving used to produce the interleaved signal portion), wherein each of the m streams includes different ones of the n data bytes, and a jth stream of the m streams includes a jth byte from each of the groups, where j is an integer such that $0 \leq j \leq m$; (b) producing m partial syndromes from the m streams; and (c) producing, on the basis of the m partial syndromes, a final syndrome indicating whether an error is detected in the interleaved signal portion. The receiver and the decoding method employed by it are able to take advantage of the error detector and simultaneously perform (a) error detection on and (b) de-interleaving of the interleaved signal portion.

30 Claims, 6 Drawing Sheets

START
```
1027    821    615    409    203
1026    820    614    408    202
1025    819    613    407    201
1024    818    612           .
1023                          5
 .       .      .     .       4
 .       .      .     .       3
 .       .      .     .       2
                413   207     1
                412   206     0
 824    618    411   205
 823    617    410   204
 822    616
```
END

START
```
205+k1   205+k2   205+k3   205+k4   203
204+k1   204+k2   204+k3   204+k4   202
203+k1   203+k2   203+k3   203+k4   201
202+k1   202+k2   202+k3            .
201+k1                              .
  .        .                        5        k1=822
  .        .        .               4        k2=616
  .        .        .      .        3        k3=410
                    .      .        2        k4=204
                  3+k3              1
 2+k1    2+k2    2+k3    2+k4       0
 1+k1    1+k2    1+k3    1+k4
  k1      k2      k3      k4
```
END 5,577,054

DEVICE AND METHOD FOR PERFORMING ERROR DETECTION ON AN INTERLEAVED SIGNAL PORTION, AND A RECEIVER AND DECODING METHOD EMPLOYING SUCH ERROR DETECTION

BACKGROUND OF THE INVENTION

1. Field of the Invention

The invention relates to a device and method for performing error detection on a digital signal portion, and a receiver and decoding method employing such error detection. In particular, the invention relates to an error detector and method for performing, and a receiver and decoding method which perform, error detection on an interleaved signal portion.

2. Description of Related Art

Digital information signals are often encoded and transmitted through transmission mediums, such as, for example, optical record carriers. Such signals can be digital audio signals representing music, or digital video signals representing full motion video, pictures, or television signals.

A digital information signal is made up of digital information signal portions. Each such digital information signal portion includes information data bytes.

When a digital information signal portion is encoded for transmission through a transmission medium, one or more error detection data bytes are typically added to the information data bytes of that digital information signal portion in a process which produces a coded signal portion. Such a coded signal portion is made up of data bytes which include the information data bytes of a digital information signal portion and the one or more error detection data bytes added thereto. Prior to transmission, the data bytes of a coded signal portion are interleaved (i.e., the coded signal portion is interleaved), producing a corresponding interleaved signal portion having the same data bytes in an interleaved order.

To obtain a replica of a digital information signal portion encoded in the manner just described (and received from a transmission medium), a decoding process including error detection is used. Such a decoding process requires that the data bytes of an interleaved signal portion be de-interleaved (i.e., the interleaved signal portion is de-interleaved), producing a corresponding de-interleaved signal portion having the same data bytes in a non-interleaved order. In the prior art, interleaved signal portions having certain types of error detection data bytes must be de-interleaved prior to error detection because of the manner in which prior art error detectors operate on the appropriate data bytes of such interleaved signal portions.

Accordingly, in the prior art, certain receivers include a de-interleaver connected in cascade with an error detector. Such receivers produce a time delay between when the data bytes of an interleaved signal portion are first available and when error detection can be performed on the appropriate data bytes. This is because the prior art error detector needs to wait for all of the data bytes of an interleaved signal portion to be stored in a de-interleaver and for that de-interleaver to begin reading out those data bytes (producing a corresponding de-interleaved signal portion) before error detection can be performed on the appropriate data bytes.

SUMMARY OF THE INVENTION

The invention eliminates the above-mentioned time delay problem by eliminating the need to de-interleave an interleaved signal portion (received from a transmission medium) prior to error detection. More particularly, it allows error detection and de-interleaving to be performed simultaneously on an interleaved signal portion. This eliminates the time delay between when the data bytes of an interleaved signal position are first available and when error detection can be performed on the appropriate data bytes. As a result, less time is required in a decoding process used to obtain a replica of a digital information signal portion from an interleaved signal portion.

A device in accordance with the invention for performing error detection on an interleaved signal portion including n successive data bytes in an interleaved order in which the interleaved signal portion was produced by interleaving a coded signal portion including the n data bytes in a non-interleaved order with m-byte interleaving (where m>n), where the n data bytes are made up of information data bytes of a digital information signal portion and at least one error detection data byte, comprises n syndrome generators, a feeder and a final generator. The m syndrome generators are adapted to produce, on the basis of the n data bytes, m partial syndromes. The feeder (a) receives the n data bytes, in successive groups of m or less data bytes each, and (b) sequentially supplies the n data bytes to the m syndrome generators so that (i) each of the m syndrome generators is supplied with different ones of the n data bytes and (ii) a jth syndrome generator of the m syndrome generators receives a jth data byte from each of the groups, where j is an integer such that $0 \leq j \leq m$. The final generator produces, on the basis of the m partial syndromes, a final syndrome indicating whether an error is detected in the interleaved signal portion.

A method in accordance with the invention for performing error detection on an interleaved signal portion having n successive data bytes in an interleaved order in which the interleaved signal portion was produced by interleaving a coded signal portion including the n data bytes in a non-interleaved order with m-byte interleaving (where m>n), where the n data bytes are made up of information data bytes of a digital information signal portion and at least one error detection data byte, comprises three steps. The first step involves (a) sequentially receiving the n data bytes in successive groups of m or less data bytes each, and (b) making the n data bytes available in m streams of successive data bytes so that (i) each of the m streams includes different ones of the n data bytes and (ii) a jth stream of the m streams includes a jth data byte from each of the groups, where j is an integer such that $0 \leq j \leq m$. The second step involves producing m partial syndromes from the m streams. The final step involves producing, on the basis of the m partial syndromes, a final syndrome indicating whether an error is detected in the interleaved signal portion.

A receiver incorporating an error detector in accordance with the invention to eliminate the above described time delay problem comprises an error detector, a de-interleaver and a receiving unit. The error detector performs error detection on an interleaved signal portion including n successive data bytes in an interleaved order in which the interleaved signal portion was produced by interleaving a coded signal portion including the n data bytes in a non-interleaved order, where the n data bytes are made up of information data bytes of a digital information signal portion and at least one error detection data byte. The de-interleaver de-interleaves the interleaved signal portion to produce a corresponding de-interleaved signal portion including the n data bytes in the non-interleaved order. The receiving unit (a) receives the interleaved signal portion, and (b) simultaneously supplies the interleaved signal portion to the error detector and the de-interleaver.

Finally, a method of decoding an interleaved signal portion including n successive data bytes in an interleaved order in which the interleaved signal portion was produced by interleaving a coded signal portion including the n data bytes in the non-interleaved order, where the n data bytes are made up of information data bytes of a digital information signal portion and at least one error detection data byte, comprises two steps. The first step involves receiving the interleaved signal portion. The second step involves simultaneously (a) performing error detection on the interleaved signal portion, and (b) de-interleaving the interleaved signal portion to produce a corresponding de-interleaved signal portion having the n data bytes in the non-interleaved order.

BRIEF DESCRIPTION OF THE DRAWINGS

The invention will now be described in greater detail with reference to the following illustrative drawings, in which.

DESCRIPTION OF THE PREFERRED EMBODIMENTS

Interleaving and De-interleaving

Coded signal portions made up of data bytes can be interleaved in a number of ways. One preferred way involves what is referred to as m-byte interleaving, for example, 5-byte interleaving (i.e., m=5).

Since the invention relates primarily to error detection, discussion of the invention can be simplified by focussing on the information data bytes and the one or more error detection data bytes included in a signal portion. (The information data bytes and the one or more error detection data bytes included in a signal portion are hereinafter referred to as "i/ed data bytes".)

Figures 1, 2, 3:
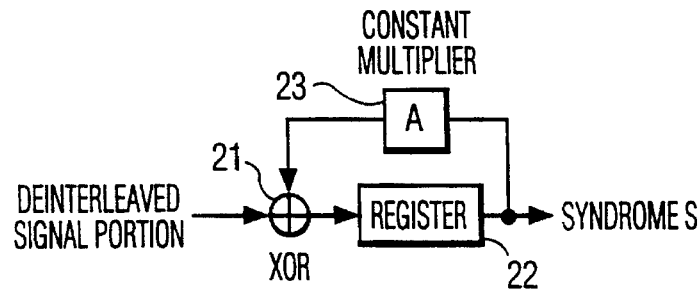
FIGS. 1, 3 and 5–7 show Interleave Tables.
FIG. 2 shows a prior art CRC (cyclic redundancy check) error detector.

FIG. 1 shows an Interleave Table indicating the manner in which 1028 8-bit i/ed data bytes included in a coded signal portion are to be read out of an interleaver providing 5-byte interleaving in producing a corresponding interleaved signal portion. (A coded signal portion which includes 1028 i/ed data bytes is hereinafter referred to as "a 1028 i/ed signal portion".)

To interleave the i/ed data bytes of a 1028 i/ed signal portion using an interleaver providing the 5-byte interleaving indicated by the Interleave Table of FIG. 1, the i/ed data bytes, whose data byte order can be represented sequentially as: $r_{1027}, r_{1026}, \ldots, r_1, r_0$, are read into the interleaver in that data byte order, i.e., i/ed data byte $r_{1027}$ is read into the interleaver first and i/ed data byte $r_0$ is read into the interleaver last. Once all of the i/ed data bytes of a 1028 i/ed signal portion are stored in the interleaver, they are read out of the interleaver in accordance with the i/ed data byte numbers shown in each row of the Interleave Table of FIG. 1, row by row, column by column, starting with the first column of the first row and ending with the last column of the last row. The corresponding interleaved signal portion which is produced (and is hereinafter referred to as "the 1028/5 interleaved signal portion") will have i/ed data bytes having the data byte order: $r_{1027}, r_{821}, r_{615}, r_{409}, r_{203}, r_{1026}, \ldots, r_{824}, r_{618}, r_{412}, r_{206}, r_0, \ldots, r_{822}, r_{616}, r_{410}, r_{204}$, where i/ed data byte $r_{1027}$ was the first i/ed data byte read out of the interleaver and i/ed data byte $r_{204}$ was the last i/ed data byte read out of the interleaver.

In order to de-interleave an interleaved signal portion to produce a corresponding de-interleaved signal portion, a process substantially similar to the one used for interleaving is used. The de-interleaving process ensures that the corresponding de-interleaved signal portion which is produced will have the same data byte order, including its i/ed data bytes, as the coded signal portion used to produce the interleaved signal portion had.

Accordingly, to de-interleave the i/ed data bytes of the 1028/5 interleaved signal portion (discussed above), the i/ed data bytes of that interleaved signal portion are read into a de-interleaver in their data byte order, i.e., in the data byte order: $r_{1027}, r_{821}, r_{615}, r_{409}, r_{203}, r_{1026}, \ldots, r_{824}, r_{618}, r_{412}, r_{206}, r_0, \ldots, r_{822}, r_{616}, r_{410}, r_{204}$, where i/ed data byte $r_{1027}$ is the first i/ed data byte read into the de-interleaver and i/ed data byte $r_{204}$ is the last i/ed data byte read into the de-interleaver. After all of the i/ed data bytes of the 1028/5 interleaved signal portion are stored in the de-interleaver, they are read out of the de-interleaver in a manner which produces, for the corresponding de-interleaved signal portion which is produced (and is hereinafter referred to as "the 1028/5 de-interleaved signal portion"), the same data byte order for the i/ed data bytes the coded signal portion used to produce the 1028/5 interleaved signal portion had, i.e., the i/ed data bytes of the 1028/5 de-interleaved signal portion will have the data byte order: $r_{1027}, r_{1026}, \ldots, r_1, r_0$, where i/ed data byte $r_{1027}$ was the first i/ed data byte read out of the de-interleaver and i/ed data byte $r_0$ was the last i/ed data byte read out of the de-interleaver.

Although the examples discussed above involved signal portions made up of 1028 i/ed data bytes, a signal portion need not have 1028 i/ed data bytes. It can have more or less i/ed data bytes. The number of i/ed data bytes included in a signal portion can be represented by the number n. Accordingly, the i/ed data byte order of a de-interleaved signal portion can be represented generically in terms of n as having the data byte order: $r_{n-1}, r_{n-2}, \ldots, r_1, r_0$.

CRC (Cyclic Redundancy Check) Error Detector

As mentioned in the BACKGROUND OF THE INVENTION section, error detection in accordance with the prior art on interleaved signal portions having certain types of error detection data bytes can only be performed after those interleaved signal portion have been de-interleaved (i.e., error detection must be performed on the corresponding de-interleaved signal portions). Such is the case for an interleaved signal portion including error detection data bytes where in order for those error detection data bytes to be used by a prior art error detector in properly performing error detection thereon the i/ed data bytes of that interleaved signal portion must be in the original data byte order of the coded signal portion which was used to produce that interleaved signal portion.

An error detector capable of performing error detection on a de-interleaved signal portion, but not an interleaved signal portion, is a prior art CRC error detector. It is noted that in order for a CRC error detector to be able to perform error detection on a de-interleaved signal portion the one or more error detection data bytes included in that de-interleaved signal portion must be CRC (cyclic redundancy check) error detection data bytes.

FIG. 2 shows a prior art CRC error detector. The CRC error detector of FIG. 2 comprises an exclusive-OR (XOR) 21, i.e., a modulo-2 adder, a register 22, i.e., a one byte register (for example, an 8-bit register); and a constant multiplier 23. The CRC error detector operates on the i/ed data bytes of a single de-interleaved signal portion at a time, i.e., n 8-bit i/ed data bytes (where n is, for example, 1028, in accordance with the examples discussed above), and generates a syndrome S from that de-interleaved signal portion being applied to it.

The n i/ed data bytes of a de-interleaved signal portion are applied, in accordance with their data byte order, one after the other, to the XOR 21 of FIG. 2. The XOR 21 adds the current contents of register 22, multiplied by a constant A, to each i/ed data byte of that de-interleaved signal portion as it is received, and the result thereof is stored in the register 22. This procedure continues until all n i/ed data bytes of that de-interleaved signal portion have been applied to the XOR 21 and the results thereof have been stored in the register 22.

The constant A is one of the primitive elements of a Galois field, which is defined by a primitive, irreducible polynomial. The primitive elements of that Galois field are signified by $0, 1, \alpha, \alpha^2, \ldots, \alpha^{k-2}$, where k indicates the number of primitive elements of that Galois field (for example, k=256). In addition, each primitive element of that Galois field corresponds to one of the sequence of values of a data byte (i.e., if a data byte is 8-bits, for example the 8 bits making up that data byte) of an interleaved or de-interleaved signal portion.

It is noted that a CRC error detector can be designed to employ any one of the primitive elements of a Galois field in generating a syndrome S (discussed below). Therefore, it should be remembered that the syndrome S which is generated from a de-interleaved signal portion being applied to it is dependent on which primitive element of a Galois field is chosen to be employed by a CRC error detector, i.e., which primitive element is the constant A equal to.

CRC Error Detector Syndrome S

If the i/ed data bytes of a de-interleaved signal portion have the data byte order: $r_{n-1}, \ldots, r_1, r_0$ (which is in accord with the generic representation of the data byte order of the i/ed data bytes of a de-interleaved signal portion (discussed above)) and the i/ed data bytes thereof are applied to the CRC error detector of FIG. 2 in that data byte order, i.e., i/ed data byte $r_{n-1}$ is applied first and i/ed data byte $r_0$ is applied last, the CRC error detector will generate the following syndrome S from that de-interleaved signal portion, after all of the i/ed data bytes of that de-interleaved signal portion have been applied to the XOR 21 and the results thereof have been stored in the register 21:

$$S = r_{n-1}A^{(n-1)} + r_{n-2}A^{(n-2)} + \ldots + r_2 A^2 + r_1 A + r_0. \quad \text{(EQ. 1)}$$

If n=1028 (in accordance with the examples discussed above), the syndrome S which is generated by a CRC error detector from a de-interleaved signal portion is:

$$S = r_{1027}A^{1027} + r_{1026}A^{1026} + \ldots + r_2 A^2 + r_1 A + r_0 \quad \text{(EQ. 2)}$$

If S, which is one data byte, has a value equal to 0, i.e., all of the bits in that data byte are 0 (e.g., 00000000), then no errors are deemed to have been detected. If S is equal to any other number, i.e., any of the bits therein has a value other than 0 (e.g., 00000001), one or more errors are deemed to have been detected.

Preferred Embodiment of Interleaved Data Byte Error Detector

The invention eliminates the need to de-interleave an interleaved signal portion prior to error detection by incorporating the de-interleaving process into the error detection process. The invention is realized by assuring that the same syndrome is generated by an interleaved data byte error detector, in accordance with the invention, receiving, data byte by data byte, the i/ed data bytes of an interleaved signal portion in accordance with its interleaved data byte order as would be generated by a prior art error detector receiving, data byte by data byte, the i/ed data bytes of a corresponding de-interleaved signal portion (produced from the interleaved signal portion) in accordance with its non-interleaved data byte order.

In a preferred embodiment, the interleaved data byte error detector operates to generate the same syndrome S by receiving, data byte by data byte, the i/ed data bytes of an interleaved signal portion in accordance with its interleaved data byte order as would be generated by a CRC error detector receiving, data byte by data byte, the i/ed data bytes of a corresponding de-interleaved signal portion (produced from the interleaved signal portion) in accordance with its non-interleaved data byte order. Accordingly, the discussion which follows pertains primarily to the manner in which an interleaved data byte error detector would operate on an interleaved signal portion in which the one or more error detection data bytes included therein (specifically in the i/ed data bytes include therein) are made up of at least one (and preferably 4) CRC error detection data bytes. The invention is not, however, limited to error detection performed on interleaved signal portions in which the one or more error detection data bytes included therein are only CRC error detection data bytes.

FIG. 3 shows the Interleave Table of FIG. 1 having been rewritten such that each i/ed data byte number, except for the i/ed data bytes numbers in the last column, is represented by the sum of two constants. One of the constants in each column, except for the last column, is the same, and one of the constants in each row, except for in the last column, is the same. The constants which are the same in each column have been designed as: k1, k2, k3 and k4, where k1=822, k2=616, k3=410 and k4=204.

It should be clear that the data byte order of the i/ed data bytes of the 1028/5 interleaved signal portion (discussed above and having the data byte order: $r_{1027}, r_{821}, r_{615}, r_{409}, r_{203}, r_{1026}, \ldots, r_{824}, r_{618}, r_{412}, r_{206}, r_0, \ldots, r_{822}, r_{616}, r_{410}, r_{204}$, where i/ed data byte $r_{1027}$ is first and i/ed data byte $r_{204}$ is last) can be expressed in terms of the constants shown in the Interleave Table of FIG. 3. Specifically, the data byte order of the i/ed data bytes of that interleaved signal portion in terms of the constants shown in the Interleave Table of FIG. 3 is: $r_{205+k1}, r_{205+k2}, r_{205+k3}, r_{205+k4}, r_{203}, r_{204+k1}, \ldots, r_{2+k}, r_{2+k2}, r_{2+k3}, r_{2+k4}, r_0, \ldots, r_{k1}, r_{k2}, r_{k3}, r_{k4}$, where i/ed data byte $r_{205+k1}$ is first and i/ed data byte $r_{k4}$ is last.

Likewise, the data byte order of the i/ed data bytes of the 1028/5 de-interleaved signal portion (discussed above and having the data byte order: $r_{1027}, r_{1026}, \ldots, r_1, r_0$, where i/ed data byte $r_{1027}$ is first and i/ed data byte $r_0$ is last) can also be expressed in terms of the constants shown in the Interleave Table of FIG. 3. Specifically, the byte order of the i/ed data bytes of that de-interleaved signal portion in terms of the constants shown in the Interleave Table of FIG. 3 is: $r_{205+k1}, r_{204+k1}, \ldots, r_{205+k2}, r_{204+k2}, \ldots, r_{205+k3}, r_{204+k3}, \ldots, r_{205+k4}, r_{204+k4}, \ldots, r_1, r_0$, where i/ed data byte $r_{205+k1}$ is first and i/ed data byte $r_0$ is last. The syndrome S which would be generated from that de-interleaved signal portion by a CRC error detector, expressed in terms of the constants of shown in the Interleave Table of FIG. 3, is:

$$S = [r_{205+k1} A^{(205+k1)} + r_{204+k1} A^{(204+k1)} + \ldots + r_{1+k1} A^{(1+k1)} + r_{k1} A^{k1}] + \quad \text{(EQ. 3)}$$
$$[r_{205+k2} A^{(205+k2)} + r_{204+k2} A^{(204+k2)} + \ldots + r_{1+k2} A^{(2+k2)} + r_{k2} A^{k2}] +$$
$$[r_{205+k3} A^{(205+k3)} + r_{204+k3} A^{(204+k3)} + \ldots + r_{1+k3} A^{(1+k3)} + r_{k3} A^{k3}] +$$
$$[r_{205+k4} A^{(205+k4)} + r_{204+k4} A^{(204+k4)} + \ldots + r_{1+k4} A^{(1+k4)} + r_{k4} A^{k4}] +$$
$$[r_{203} A^{203} + r_{202} A^{202} + \ldots + r_1 A^1 + r_0].$$

Through simple algebra, EQ. 3 becomes:

$$S = [r_{205+k1} A^{205} + r_{204+k1} A^{204} + \ldots + r_{1+k1} A + r_{k1}] A^{k1} + \quad \text{(EQ. 4)}$$
$$[r_{205+k2} A^{205} + r_{204+k2} A^{204} + \ldots + r_{1+k2} A + r_{k2}] A^{k2} +$$
$$[r_{205+k3} A^{205} + r_{204+k3} A^{204} + \ldots + r_{1+k3} A + r_{k3}] A^{k3} +$$
$$[r_{205+k4} A^{205} + r_{204+k4} A^{204} + \ldots + r_{1+k4} A + r_{k4}] A^{k4} +$$
$$[r_{203} A^{203} + r_{202} A^{202} + \ldots + r_1 A + r_0].$$

EQ. 4 indicates how the same syndrome S which is generated from a de-interleaved signal portion can be generated from a corresponding interleaved signal portion. Specifically, EQ. 4 shows how that syndrome S, which is the syndrome S which would be generated by a CRC error detector from the 1028/5 de-interleaved signal portion (discussed above and expressed in terms of the constants shown in the Interleave Table of FIG. 3) when the one or more error detection data bytes included therein are CRC error detection data bytes, can be generated from the 1028/5 interleaved signal portion (discussed above and expressed in terms of the constants shown in the Interleave Table of FIG. 3) when the one or more error detection data bytes included therein are CRC error detection data bytes. The manner in which this can be realized is discussed below with reference to FIG. 4.

Figure 4:
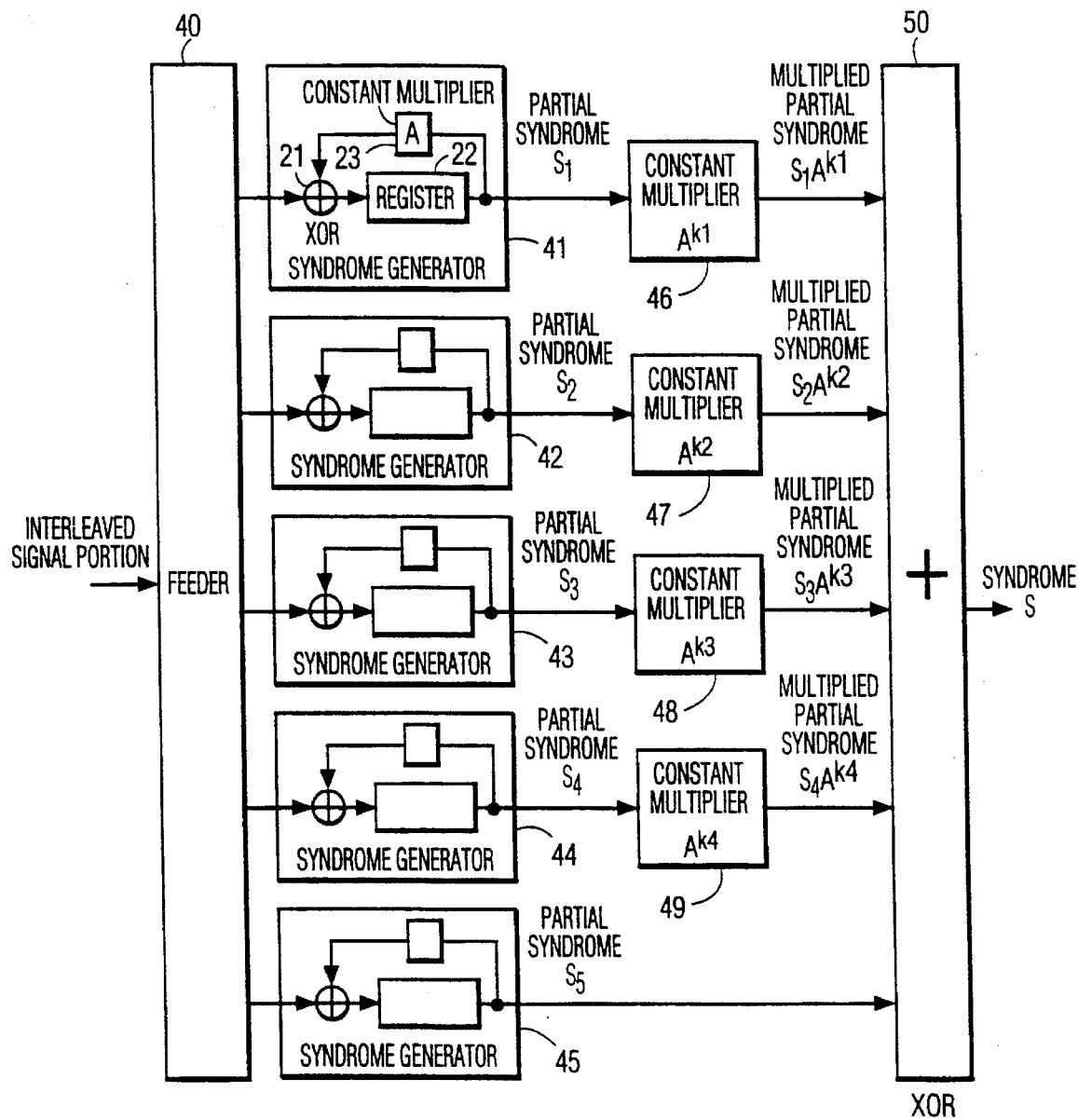
FIGS. 4 and 8 show interleaved data byte error detectors in accordance with the invention.

FIG. 4 shows a preferred embodiment of an interleaved data byte error detector in accordance with the invention for use with the 1028/5 interleaved signal portion (discussed above and expressed in terms of the constants of shown in the Interleave Table of FIG. 3) when the one or more error detection data bytes included therein are CRC error detection data bytes. The interleaved data byte error detector of FIG. 4 contains a feeder 40, for example, a 1-5 serial to parallel data byte stream converter; 5 syndrome generators 41–45, each of which is a CRC error detector; 4 constant multiplies 46–49; and a five input exclusive-OR (XOR) 50. Each of the inputs to the syndrome generators 41–45 is connected to an associated output of the feeder 40. Each of the outputs of the syndrome generators 41–44 is connected to the input of an associated constant multiplier of the group of constant multipliers 46–49. Specifically, the output of syndrome generator 41 is connected to the input of constant multiplier 46; the output of syndrome generator 42 is connected to the input of constant multiplier 47; the output of syndrome generator 43 is connected to the input of constant multiplier 48; and output of syndrome generator 44 is connected to the input of constant multiplier 49. Each of the outputs of the constant multipliers 46–49 and the syndrome generator 45 is connected to an associated input of the XOR 50.

The feeder 40 of FIG. 4 receives the i/ed data bytes of the 1028/5 interleaved signal portion (having a serial data byte stream) in successive groups of i/ed data bytes, which groups each contain 5 successive i/ed data bytes, except for the last two groups which each contain 4 successive i/ed data bytes. (It is noted that if the i/ed data byte numbers in column 5 of The Interleave Table of FIG. 3 were organized differently, i.e., there were blanks in two rows other than the last two rows of the last column, the groups containing 5 i/ed data bytes and the groups containing 4 i/ed data bytes would be different. Which groups have how many i/ed data bytes corresponds to the number of i/ed data byte numbers contained in each row of the Interleave Table for the i/ed data bytes of a coded signal portion.)

The feeder 40 of FIG. 4 sequentially supplies the i/ed data bytes of the 1028/5 interleaved signal portion to the syndrome generators 41–45 such that each of the syndrome generators is supplied with a different i/ed data byte, and the first, second, third, fourth and fifth syndrome generators, 41–45, respectively, receive the first, second, third, fourth and fifth i/ed data bytes, respectively, from each of the groups, except that the fifth syndrome generator, 45, does not receive an i/ed data byte from the last two groups. Specifically, the i/ed data bytes of the 1028/5 interleaved signal portion are supplied by the feeder 40 to the syndrome generators 41–45 as follows: the first i/ed data byte is supplied by the feeder 40 to the syndrome generator 41; the second i/ed data byte is supplied by the feeder 40 to the syndrome generator 42; the third i/ed data byte is supplied by the feeder 40 to the syndrome generator 43; the fourth i/ed data byte is supplied by the feeder 40 to the syndrome generator 44; the fifth i/ed data byte is supplied by the feeder 40 to the syndrome generator 45; the sixth i/ed data byte is supplied by the feeder 40 to the syndrome generator 41; etc.; the ninth from the last i/ed data byte is supplied by the feeder 40 to the syndrome generator 45; the eighth from the last i/ed data byte is supplied by the feeder 40 to the syndrome generator 41; the seventh from the last i/ed data byte is supplied by the feeder 40 to the syndrome generator 42; the sixth from the last i/ed data byte is supplied by the feeder 40 to the syndrome generator 43; the fifth from the last i/ed data byte is supplied by the feeder 40 to the syndrome generator 44; the fourth from the last i/ed data byte is supplied by the feeder 50 to the syndrome generator 41; the third from the last i/ed data byte is supplied by the feeder 40 to the syndrome generator 42; the second from the last i/ed data byte is supplied by the feeder 40 to the syndrome generator 43; and the last i/ed data byte is supplied by the feeder 40 to the syndrome generator 44.

As a result of the manner in which the i/ed data bytes are supplied to the syndrome generators 41–45, each syndrome generator generates what will hereinafter be referred to as "a partial syndrome". Since the data byte order of the i/ed data bytes of the 1028/5 interleaved signal portion is, as discussed above: $r_{205+k1}, r_{205+k2}, r_{205+k3}, r_{205+k4}, r_{203}, r_{204+k1}, \ldots, r_{2+k1}, r_{2+k2}, r_{2+k3}, r_{2+k4}, r_0, \ldots, r_{k1}, r_{k2}, r_{k3}, r_{k4}$, and those i/ed data bytes are supplied to the interleaved data byte error detector of FIG. 4 in that data byte order, i.e., i/ed data byte $r_{205+k1}$ is first and i/ed data byte $r_{k4}$ is last, the following syndrome generators will receive the following i/ed data bytes and generate the following partial syndromes:

a) the syndrome generator 41 will receive the i/ed data bytes $r_{205+k1}, r_{204+k1}, \ldots, r_{1+k1}, r_{k1}$, and generate the partial syndrome:

$$S_1 = [r_{205+k1} A^{205} + r_{204+k1} A^{204} + \ldots + r_{1+k1} A + r_{k1}]; \quad \text{(EQ. 5)}$$

b) the syndrome generator 42 will receive the i/ed data bytes $r_{205+k2}, r_{204+k2}, \ldots, r_{1+k2}, r_{k2}$, and generate the partial syndrome:

$$S_2=[r_{205+k2}A^{205}+r_{204+k2}A^{204}+\ldots+r_{1+k2}A+r_{k2}]; \quad \text{(EQ. 6)}$$

c) the syndrome generator 43 will receive the i/ed data bytes $r_{205+k3}, r_{204+k3}, \ldots, r_{1+k3}, r_{k3}$, and generate the partial syndrome:

$$S_3=[r_{205+k3}A^{205}+r_{204+k3}A^{204}+\ldots+r_{1+k3}A+r_{k3}]; \quad \text{(EQ. 7)}$$

d) the syndrome generator 44 will receive the i/ed data bytes $r_{205+k4}, r_{204+k4}, \ldots, r_{1+k4}, r_{k4}$, and generate the partial syndrome:

$$S_4=[r_{205+k4}A^{205}+r_{204+k4}A^{204}+\ldots+r_{1+k4}A+r_{k4}]; \text{ and} \quad \text{(EQ. 8)}$$

e) the syndrome generator 45 will receive the i/ed data bytes $r_{203}, \ldots, r_0$, and generate the partial syndrome:

$$S_5=[r_{203}A^{203}+r_{202}A^{202}+\ldots+r_1A+r_0]. \quad \text{(EQ. 9)}$$

The partial syndromes generated by the syndrome generators 41–44 are then applied to the constant multipliers 46–49, respectively, where each is multiplied by an associated multiplier constant to produce a multiplied partial syndrome. In the current example, the following constant multipliers multiply the following partial syndromes by the following associated multiplier constants to produce the following:

a) constant multiplier 46 multiplies the partial syndrome $S_1$, generated by syndrome generator 41, by $A^{k1}$ to produce the multiplied partial syndrome $S_1 A^{k1}$, i.e.:

$$S_1A^{k1}=[r_{205+k1}A^{205}+r_{204+k1}A^{204}+\ldots+r_{1+k1}+r_{k1}]A^{k1}; \quad \text{(EQ. 10)}$$

b) constant multiplier 47 multiplies the partial syndrome $S_2$, generated by syndrome generator 42, by $A^{k2}$ to produce the multiplied partial syndrome $S_2 A^{k2}$, i.e.:

$$S_2A^{k2}=[r_{205+k2}A^{205}+r_{204+k2}A^{204}+\ldots+r_{1+k2}+r_{k2}]A^{k2}; \quad \text{(EQ. 11)}$$

c) constant multiplier 48 multiplies the partial syndrome $S_3$, generated by syndrome generator 43, by $A^{k3}$ to produce the multiplied partial syndrome $S_3 A^{k3}$, i.e.:

$$S_3A^{k3}=[r_{205+k3}A^{205}+r_{204+k3}A^{204}+\ldots+r_{1+k3}+r_{k3}]A^{k3}; \text{ and} \quad \text{(EQ. 12)}$$

d) constant multiplier 49 multiplies the partial syndrome $S_4$, generated by syndrome generator 44, by $A^{k4}$ to produce the multiplied partial syndrome $S_4 A^{k4}$, i.e.:

$$S_4A^{k4}=[r_{205+k4}A^{205}+r_{204+k4}A^{204}+\ldots+r_{1+k4}+r_{k4}]A^{k4}. \quad \text{(EQ. 13)}$$

It is noted that none of the associated multiplier constants used by an interleaved data byte error detector needs to be the same. However, the same constant A must be used by each of the constant multipliers 46–49 (in producing the associated multiplier constants) and employed by each of the syndrome generators 41–45 of an interleaved data byte error detector.

Finally, the multiplied partial syndromes produced by the constant multipliers 46–49 and the partial syndrome generated by syndrome generator 45 are applied to the XOR 50, via its associated inputs, wherein they are added together, via modulo-2 addition, to produce the syndrome S from the 1028/5 interleaved signal portion, i.e.:

$$\begin{aligned}S &= S_1A^{k1}+S_2A^{k2}+S_3A^{k3}+S_4S^{k4}+S_5 \quad \text{(EQ. 14)}\\
&= [r_{205+k1}A^{205}+r_{204+k1}A^{204}+\ldots+r_{1+k1}A+r_{k1}]A^{k1}+\\
&\quad [r_{205+k2}A^{205}+r_{204+k2}A^{204}+\ldots+r_{1+k2}A+r_{k2}]A^{k2}+\\
&\quad [r_{205+k3}A^{205}+r_{204+k3}A^{204}+\ldots+r_{1+k3}A+r_{k3}]A^{k3}+\\
&\quad [r_{205+k4}A^{205}+r_{204+k4}A^{204}+\ldots+r_{1+k4}A+r_{k4}]A^{k4}+\\
&\quad [r_{203}A^{203}+r_{202}A^{202}+\ldots+r_1A+r_0]\end{aligned}$$

Other Embodiments Of An Interleaved Data Byte Error Detector

Up to this point, the invention has been described primarily in terms of signal portions having 1028 i/ed data bytes (i.e., n=1028) and having been interleaved using 5-byte interleaving (i.e., m=5). (More particularly, the invention has been described in terms of the 1028/5 interleaved and de-interleaved signal portions when the one or more error detection data bytes included therein are CRC error detection data bytes.) Nevertheless, the values of m and n (as mentioned before) can be different. Accordingly (with the basics behind the invention having now been described), it is appropriate to discuss the invention in a more general manner. (Nevertheless, the discussion which follows still pertains primarily to interleaved signal portions in which the one or more detection data bytes included therein are CRC error detection data bytes.)

Figure 5:
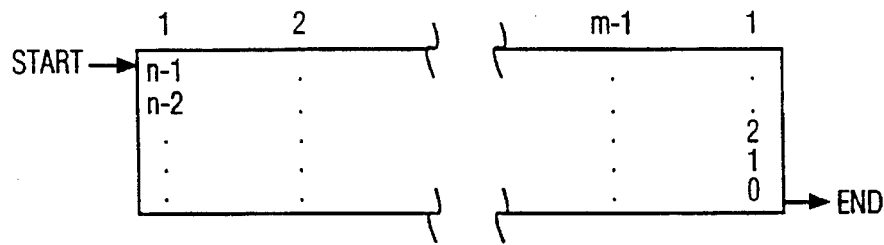

FIG. 5 shows a generic Interleave Table for the i/ed data bytes of a coded signal portion. The Interleave Table of FIG. 5 has m columns, and the n i/ed data bytes numbers are distributed throughout those columns, column by column, row by row, beginning with first row of each column. The first i/ed data byte number is in the first row of the first column and the last i/ed data byte number is in the last row of the last column to receive an i/ed data byte number. The last row in the last column to receive an i/ed data byte number need not be the last row in the last column). (See FIG. 1, for example, where the last i/ed data byte number in the last column is the third to last row of that column.) In addition, each column of that FIG. 5 need not have the same number of i/ed data byte numbers. (For example, the first column could have 206 i/ed data byte numbers while the last column could have 204 i/ed data byte numbers, as is the case in FIG. 1).

Figure 6:
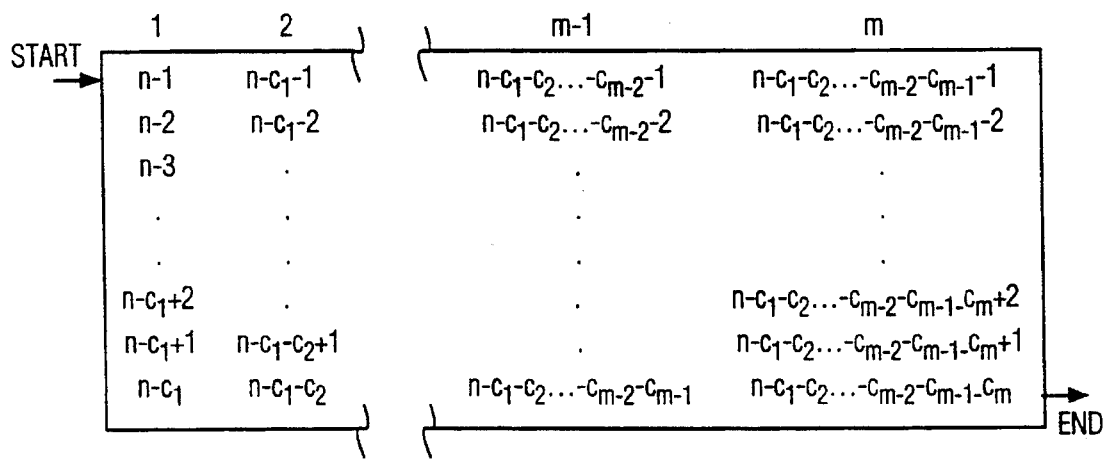

A new constant, $c_i$, can be introduced into the Interleave Table of FIG. 5 in the manner shown in FIG. 6. $c_i$ is the number of i/ed data byte numbers in column i of the Interleave Table of FIG. 6, and i is between 1 and m. Because the last i/ed data byte number in the last column of the Interleave Table of FIG. 6 must be zero, i.e.:

$$0=n-c1-c2-\ldots cm-2-cm-1-cm \quad \text{(EQ. 15)}$$

then:

$$n=c1+c2+\ldots+cm-2+cm-1+cm. \quad \text{(EQ. 16)}$$

Figure 7:
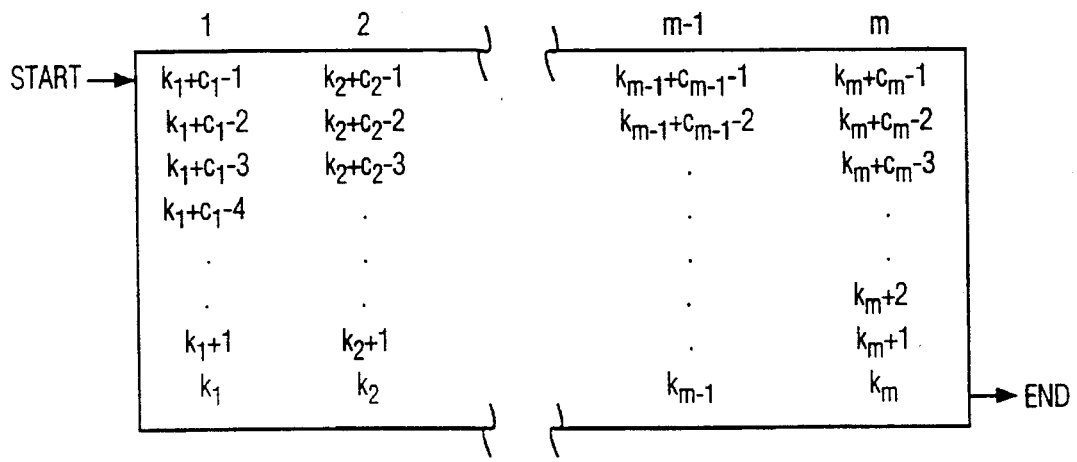

If n in the Interleaved Table of FIG. 6 is now replaced by: $c1+c2+\ldots+cm-2+cm-1+cm$, and new constants k1 through km, where:

$$k1 = \quad c2 + \ldots + cm\text{-}2 + cm\text{-}1 + cm;$$
$$k2 = \quad c3 + \ldots + cm\text{-}2 + cm\text{-}1 + cm;$$
$$\vdots$$
$$km\text{-}1 = \quad cm; \text{ and}$$
$$km = \quad 0;$$
(EQ. 17)

are introduced, then the Interleave Table of FIG. 6 becomes the Interleave Table of FIG. 7

From the Interleave Table of FIG. 7 and the discussions provided above concerning the syndrome S which one wishes to generate in accordance with the invention (from an interleaved signal portion in which the one or more error detection data bytes included therein are CRC error detection data bytes), it should be clear that the syndrome S which one wishes to generate from an interleaved signal portion in which the one or more error detection data bytes included therein are CRC error detection data bytes) in accordance with the invention (expressed in terms of the constants shown in FIG. 7) is:

$$
\begin{aligned}
S = \quad & [r_{k1+c1-1} A^{(c1-1)} + r_{k1+c1-2} A^{(c2-2)}] + \ldots + [r_{k1+1} A^1 + r_{k1+0} A^0] A^{k1} + \\
& [r_{k2+c2-1} A^{(c2-1)} + r_{k2+c2-2} A^{(c2-2)}] + \ldots + [r_{k2+1} A^1 + r_{k2+0} A^0] A^{k2} + \\
& \vdots \\
& [r_{km-1+cm-1-1} A^{(cm-1-1)} + r_{km-1+cm-1+2} A^{(cm-1+2)}] + \ldots + [r_{km-1+1} A^1 + r_{km-1+0} A^0] A^{km-1} + \\
& [r_{cm-1} A^{(cm-1)} + r_{cm-2} A^{(cm-2)}] + \ldots + [r_1 A^1 + r_0 A^0] A^{km}.
\end{aligned}
$$
(EQ. 18)

It is noted that the syndrome S of EQ. 18 is the same syndrome S which would be generated by a CRC error detector from a corresponding de-interleaved signal portion (expressed in terms of the constants shown in FIG. 7) produced by de-interleaving the interleaved signal portion from which the syndrome S of FIG. 18 was generated. In addition, it is noted that in EQ. 18, km=0 (see EQ. 17) and $A^0=1$.

Figure 8:
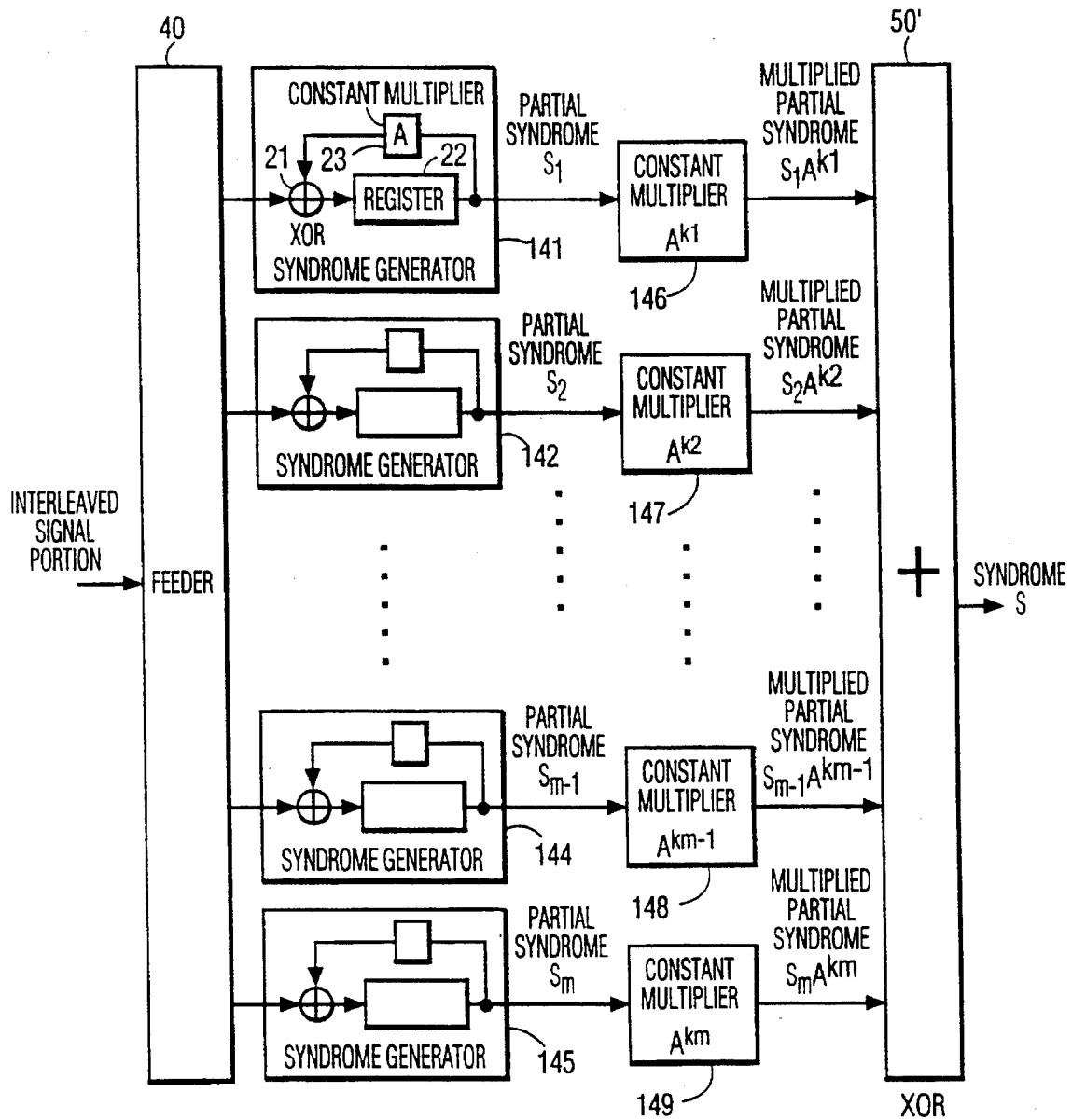

A generic interleaved data byte error detector (which operates with an interleaved signal portion in which the error detection data bytes include therein are CRC error detection data bytes) in accordance with the invention is shown in FIG. 8. The interleaved data byte error detector of FIG. 8 includes a feeder 40, m syndrome generators (141, 142, 144 and 145 being shown), m constant multipliers (146, 147, 148 and 149 being shown) and an m input exclusive-OR (XOR) 50'.

The interleaved data byte error detector of FIG. 8 operates in substantially the same manner as the interleaved data byte error detector of FIG. 4. The feeder 40 receives the i/ed data bytes of an interleaved signal portion (having a serial data byte stream) in successive groups of m or less i/ed data bytes each, and sequentially supplies the i/ed data bytes to the m syndrome generators. Each of the m syndrome generators is supplied with a different i/ed data byte, and a jth syndrome generator receives a jth i/ed data byte from each of the groups, where j is an integer such that $0 \leq j \leq m$. The partial syndromes generated by the syndrome generates (141, 142, 144 and 145, for example) are then applied to the constant multipliers (146, 147, 148 and 149, for example), respectively, where each is multiplied by an associated multiplier constant to produce a multiplied partial syndrome. Finally, the multiplied partial syndromes produced by the constant multipliers (146, 147, 148 and 149, for example) are applied to the XOR 50', via its associated inputs, wherein they are added together, via modulo-2 addition, to produce the syndrome S from the interleaved signal portion provided to feeder 40.

It is noted that because km=0 and $A^0=1$, constant multiplier 149 of FIG. 8 is actually a unity multiplier. Therefore, constant multiplier 14a can be eliminated, and the output of the partial syndrome generator 145 can be connected directly to the appropriate input of the XOR 50'. (FIG. 4, for example, shows such an embodiment).

Prior Art Receiver

Figure 9:
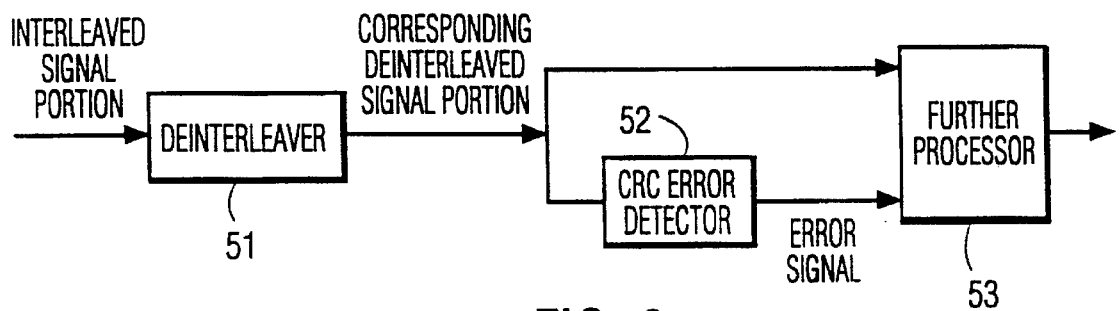
FIG. 9 shows a portion of a prior art receiver.

FIG. 9 shows a portion of a prior art receiver. That portion includes a de-interleaver 51, a CRC error detector 52, and a further processor 53 having two inputs. The further processor 53 could be, or could include, an error correction processor.

The output of the de-interleaver 51 is connected to the input of the CRC error detector 52 and one of the inputs of the further processor 53. The output of the CRC error detector 52 is connected to the other input of the further processor 53.

The de-interleaver 51 receives an interleaved signal portion (having, for example, 1028 i/ed data bytes) from a transmission medium, and de-interleaves that interleaved signal portion to produce a corresponding de-interleaved signal portion (having, for example, 1028 i/ed data bytes). The de-interleaved signal portion produced by the de-interleaver 51 is then supplied to the CRC error detector 52 and the further processor 53.

The CRC error detector 52 performs error detection on a de-interleaved signal portion supplied to it. If one or more errors are detected in a de-interleaved signal portion, an error signal is generated by the CRC error detector 52 at its output, and the error signal is supplied to the further processor 53. If the further processor 53 is, or includes, an error correction processor, that error correction processor can operate such that it will perform error correction on a de-interleaved signal portion, for which the CRC error detector 52 detected one or more errors, when the error signal is received.

It is noted that the de-interleaved signal portion may need to contain error correction data bytes in order for an error correction processor to be able to perform error correction thereon. The manner in which a coded signal portion is encoded so that a de-interleaved signal portion derived therefrom includes error correction data bytes, and the manner in which error correction is performed (for example, via the Solomon-Reed method) are known.

If no errors are detected in a de-interleaved signal portion, the CRC error detector 52 does not generate the error signal. If the further processor 53 is, or includes, an error correction processor, that error correction processor can operate such that it will not perform error correction on a de-interleaved signal portion, for which the CRC error detector 52 did not detect any errors, when the error signal is not received.

The portion of the receiver shown in FIG. 9 suffers from the time delay problem mentioned in the BACKGROUND OF THE INVENTION section. That time delay problem exists because the receiver of FIG. 9 requires that an interleaved signal portion be de-interleaved prior to error detection. Accordingly, the CRC error detector 52 must wait for the de-interleaver 51 to store all of the data bytes of an interleaved signal portion and to begin reading out those data bytes (resulting in production of a corresponding de-interleaved signal portion) before the CRC error detector 52 can begin error detection.

In addition, to the extent that the further processor 53 requires that the CRC error detector 52 finish performing error detection prior to being able to begin further processing of a de-interleaved signal portion, a time delay will exist between when the de-interleaver 51 makes the de-interleaved signal portion available and when the further processor 53 can begin further processing of a de-interleaved signal portion. Such is the case when the further processor 53 is, or includes, an error correction processor which is designed to operate only on a de-interleaved signal portion which has one or more errors, for the error correction processor will need to wait unit the CRC error detector 52 finishes performing error detection before it will know whether or not to perform error correction on a de-interleaved signal portion.

Receiver Employing Interleaved Data Byte Error Detector

Figure 10:
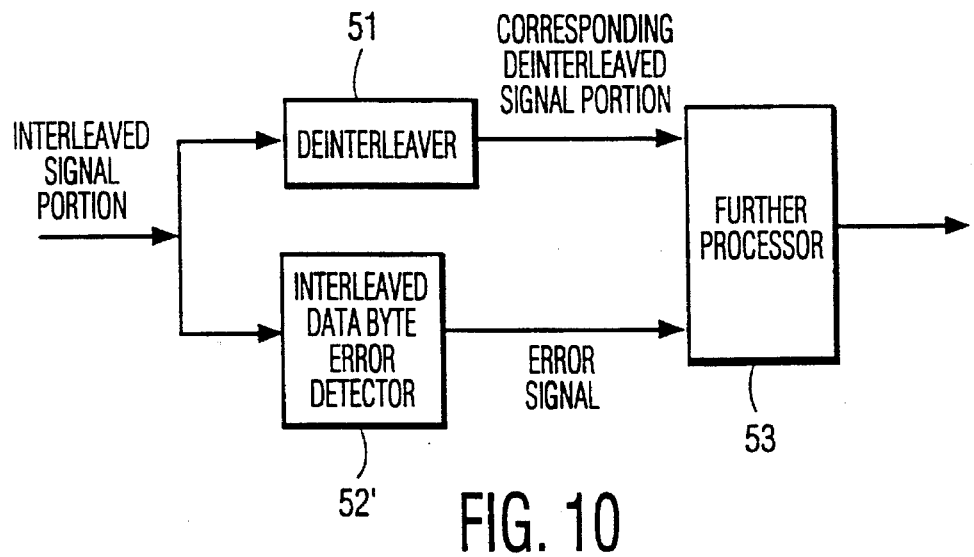
FIGS. 10 and 11 show portions of a receiver in accordance with the invention.

FIG. 10 shows a portion of a receiver which utilizes an interleaved data byte error detector 52' in accordance with the invention (preferably the interleaved data byte error detector of FIG. 4). A receiver which utilizes the portion of the receiver shown in FIG. 10 eliminates the time delay problems just discussed because it does not need to de-interleave an interleaved signal portion prior to error detection.

As with the portion of the receiver shown in FIG. 9, the portion of the receiver shown in FIG. 10 also includes a de-interleaver 51 and a further processor 53 having two inputs. However, in the portion of the receiver shown in FIG. 10, the inputs to the de-interleaver 51 and the interleaved data byte error detector 52' are coupled together. In addition the output of the de-interleaver 51 is connected to one of the inputs of the further processor 53, and the output of the interleaved data byte error detector 52' is connected to the other input of the further processor 53.

The de-interleaver 51 and the interleaved data byte error detector 52' of FIG. 10 both receive an interleaved signal portion (having, for example 1028 i/ed data bytes) from a transmission medium, for example, an optical record carrier, simultaneously. The de-interleaver 51 de-interleaves the interleaved signal portion, producing a corresponding de-interleaved signal portion (having, for example, 1028 i/ed data bytes), simultaneously while the interleaved data byte error detector 52' performs error detection on that interleaved signal portion.

The interleaved data byte error detector 52' generates an error signal at its output if one or more errors are detected in an interleaved signal portion, and the error signal is supplied to the further processor 53. If the further processor 53 is, or includes, an error correction processor, that error correction processor can operate such that it will perform error correction on a corresponding de-interleaved signal portion, produced from an interleaved signal portion for which the interleaved data byte error detector 52' detected one or more errors, when the error signal is received.

If no errors are detected in an interleaved signal portion, the interleaved data byte error detector 52' does not generate the error signal. If the further processor 53 is, or includes, an error correction processor, that error correction processor can operate such that it will not perform error correction on a corresponding de-interleaved signal portion, produced from an interleaved signal for which the interleaved data byte error detector 52' did not detect any errors, when no error signal is received.

Use of Multiple Interleaved Data Byte Error Detectors

Finally, it is noted that there is a finite (non-zero) probability that an error pattern which exists in an interleaved signal portion will not be detected by an interleaved data byte error detector. Such can be the case with the interleaved data byte error detectors of FIGS. 4 and 8. Which error pattern or patterns will not be detected by the interleaved data byte error detectors of FIGS. 4 and 8 will depend on which one of the primitive elements of the Galois field is chosen for the constant A employed by the syndrome generators (i.e., the CRC error detectors) used in either of those interleaved data byte error detectors.

Since different primitive elements tend to cause an interleaved data byte error detector to miss different patterns, the risk of an error pattern not being detected can be reduced by using two or more interleaved data byte error detectors, employing different constants A (i.e., different primitive elements), in parallel with one another in a receiver. In a preferred embodiment, four interleaved data byte error detectors are used in parallel. Such an embodiment is shown in FIG. 11.

Figure 11:
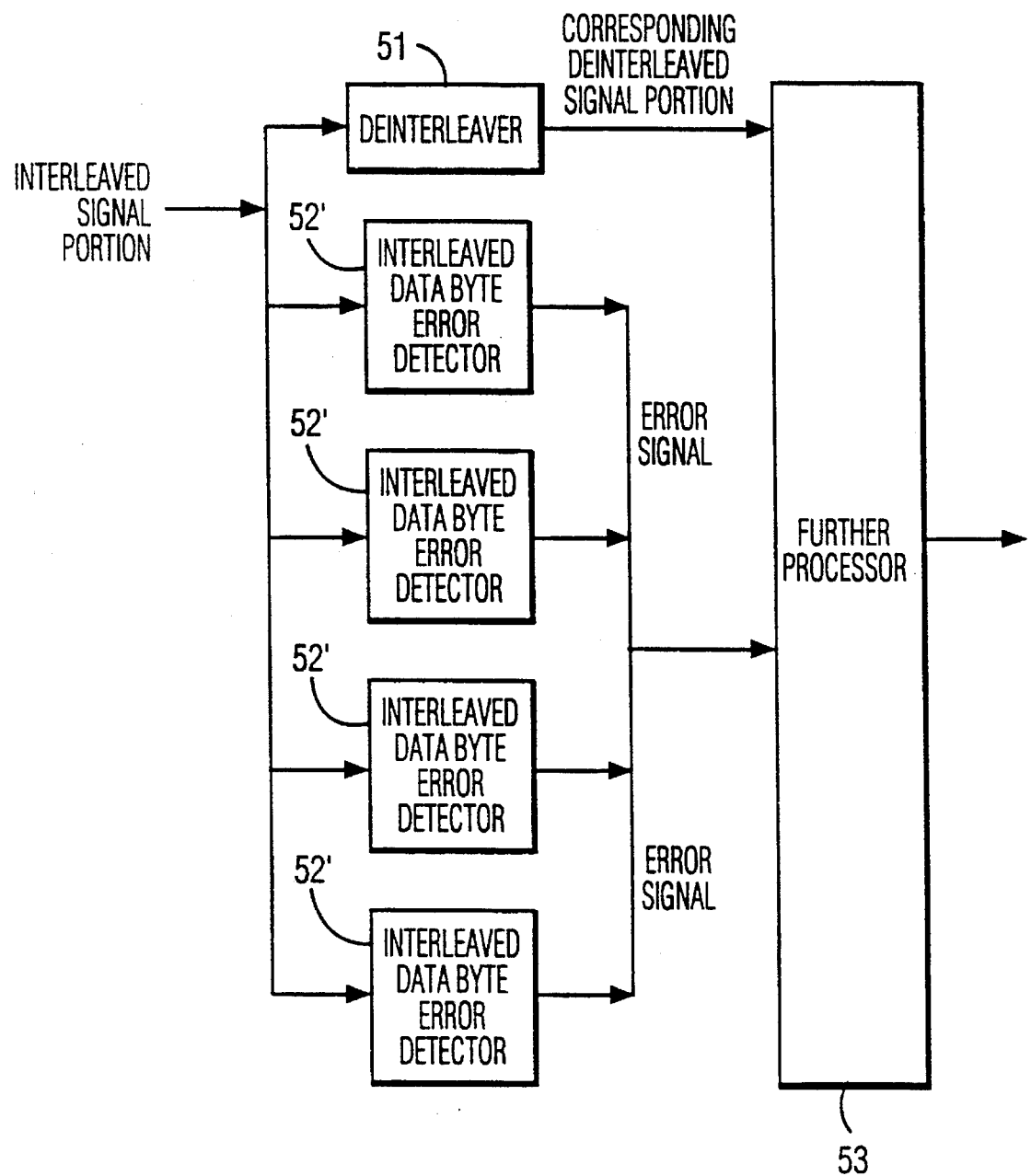

The portion of the receiver shown in FIG. 11 is essentially the same as the portion of the receiver shown in FIG. 10, except that it has four interleaved data byte error detectors 52' instead of one. The outputs of the interleaved data byte error detectors 52' of FIG. 11 are coupled together and connected to the input of the further processor 53 which is not connected to the output of the de-interleaver 51.

In a preferred embodiment, the four interleaved data byte error detectors 52' of FIG. 11 employ the primitive elements $\alpha^{20}$, $\alpha^{21}$, $\alpha^{22}$ and $\alpha^{23}$, respectively, as their constants A. Although the constant A employed by each of the different interleaved data byte error detectors 52' need not be the same, the constant A used by each of the constant multipliers (in producing the associated multiplier constants) and employed by each of the syndrome generators of a given interleaved data byte error detector 52' must be the same.

Each interleaved data byte error detector 52' of FIG. 11 simultaneously receives an interleaved signal portion concurrently with the de-interleaver 51. Each of the interleaved data byte error detectors 52' simultaneously performs error detection on an interleaved signal portion currently while the de-interleaver 51 de-interleaves that interleaved signal portion to produce a corresponding de-interleaved signal portion.

If any of the interleaved data byte error detectors 52' detects one or more errors, it generates an error signal which is supplied to the further processor 53. If the further processor 53 is, or includes, an error correction processor, that error correction processor can operate such that it will perform error correction on a corresponding de-interleaved signal portion, produced from an interleaved signal portion for which any of interleaved data byte error detectors 52' detected one or more errors, when an error signal is received from any of the interleaved data byte error detectors 52'.

If no errors are detected in an interleaved signal portion by any of the interleaved data byte error detectors 52', none of the interleaved data byte error detectors 52' generates an error signal. If the further processor 53 is, or includes, an error correction processor, that error correction processor can operate such that it will not perform error correction on a corresponding de-interleaved signal portion, produced from an interleaved signal for which none of the interleaved data byte error detectors 52' detected any errors, when no error signal is received from any of the interleaved data by error detection 52'.

I claim:

1. A device for performing error detection on an interleaved signal portion including n successive data bytes in an interleaved order in which the interleaved signal portion was produced by interleaving a coded signal portion including the n data bytes in a non-interleaved order with m-byte interleaving, the n data bytes being made up of information data bytes of a digital information signal portion and at least one error detection data byte, the detector comprising:

m syndrome generators adapted to produce, on the basis of the n data bytes, m partial syndromes;

feeder means for (a) receiving the n data bytes in the interleaved order in successive groups of m or less data bytes each, and (b) sequentially supplying the n data bytes to said m syndrome generators so that (i) each of said m syndrome generators is supplied with different ones of the n data bytes and (ii) a jth syndrome generator of the m syndrome generators receives a jth data byte from each of the groups, where j is an integer such that $0 \leq j \leq m$; and generator means for producing, on the basis of the m partial syndromes, a final syndrome indicating whether an error is detected in the interleaved signal portion.

2. The device as claimed in claim 1, wherein the jth syndrome generator includes:

an exclusive-OR, having a first input, a second input and an output, said first input of said exclusive-OR being adapted to receive the jth data byte from each of the groups;

a constant multiplier, having an input and an output, said output of said constant multiplier being coupled to said second input of said exclusive-OR; and a register having an input and an output, said input of said register being coupled to said output of said exclusive-OR, and said output of said register being coupled to said input of said constant multiplier.

3. The device as claimed in claim 1, wherein each of said m syndrome generators is a CRC error detector employing use of a constant which is a primitive element of a Galois field, and all of the constants are the same.

4. The device as claimed in claim 1, wherein the at least one error detection data byte is 4 CRC error detection data bytes.

5. The device as claimed in claim 1, wherein said generator means includes:

m multipliers adapted to multiply the m partial syndromes each individually by an associated constant to produce m multiplied partial syndromes, each of said m multipliers being coupled to a different one of said m syndrome generators; and an exclusive-OR adapted to combine the m multiplied partial syndromes using modulo-2 addition to produce the final syndrome, said exclusive-OR being coupled to each of said m multipliers.

6. The device as claimed in claim 5, wherein each associated constant has a value which is a function of (a) the same primitive element of a Galois field and (b) a value corresponding to where within the coded signal portion the last data byte of the n data bytes supplied to the syndrome generator used to produce the partial syndrome which is multiplied by that associated constant is located.

7. The device as claimed in claim 1, wherein said generator means includes m−1 multipliers adapted to multiply m−1 of the m partial syndromes each individually by an associated constant to produce m−1 multiplied partial syndromes, each of said m−1 multipliers being coupled to a different one of said m syndrome generators; and an exclusive-OR adapted to combine the m−1 multiplied partial syndromes and that one of the m partial syndromes which is not multiplied by an associated constant using modulo-2 addition to produce the final syndrome, said exclusive-OR being coupled to each of said m−1 multipliers.

8. The device as claimed in claim 7, wherein each associated constant has a value which is a function of (a) the same primitive element of a Galois field and (b) a value corresponding to where within the coded signal portion the last data byte of the n data bytes supplied to the syndrome generator used to produce the partial syndrome which is multiplied by that associated constant is located.

9. The device as claimed in claim 7, wherein at least one of the groups has m data bytes and at least one of the groups has less than m data bytes.

10. The device as claimed in claim 7, wherein m=5 and n=1028.

11. A method for performing an error detection on an interleaved signal portion including n successive data bytes in an interleaved order in which the interleaved signal portion was produced by interleaving a coded signal portion including the n data bytes in a non-interleaved order with m-byte interleaving, the n data bytes being made up of information data bytes of a digital information signal portion and at least one error detection data byte, method comprising:

(a) sequentially receiving the n data bytes in the interleaved order in successive groups of m or less data bytes each, and (b) making the n data bytes available in m streams of successive data bytes so that (i) each of the m streams includes different ones of the n data bytes and (ii) a jth stream of the m streams includes a jth data byte from each of the groups, where j is an integer such that $0 \leq j \leq m$;

producing m partial syndromes from the m streams; and producing, on the basis of the m partial syndromes, a final syndrome indicating whether an error exists in the interleaved signal portion.

12. The method as claimed in claim 11, wherein the at least one error detection data byte is a CRC error detection data byte, and the final syndrome is the same syndrome which would be produced by a CRC error detector performing error detection on a de-interleaved signal portion including the n data bytes in the non-interleaved order produced by de-interleaving the interleaved signal portion.

13. The method as claimed in claim 11, wherein the at least one error detection data byte is 4 CRC error detection data bytes.

14. The method as claimed in claim 11, wherein said final syndrome is produced by:

multiplying the m partial syndromes each individually by an associated constant to produce m multiplied partial syndromes; and combining the m multiplied partial syndromes using modulo-2 addition to produce the final syndrome.

15. The method as claimed in claim 14, wherein each associated constant has a value which is a function of (a) the same primitive element of a Galois field and (b) a value corresponding to where within the coded signal portion the last data byte of the stream used to produce the partial syndrome which is multiplied by that associated constant is located.

16. The method as claimed in claim 11, wherein said final syndrome is produced by:

multiplying m−1 of the m partial syndromes each individually by an associated constant to produce m−1 multiplied partial syndromes; and combining the m−1 multiplied partial syndromes and that one of the m partial syndromes which is not multiplied by an associated constant using modulo-2 addition to produce the final syndrome.

17. The method as claimed in claim 16, wherein each associated constant has a value which is a function of (a) the same primitive element of a Galois field and (b) a value corresponding to where within the coded signal portion the last data byte of the stream used to produce the partial syndrome which is multiplied by that associated constant is located.

18. The method as claimed in claim 16, wherein at least one of the groups has m data bytes and at least one of the groups has less than m data bytes.

19. The method as claimed in claim 16, wherein m=5 and n=1028.

20. A receiver, comprising:

error detector means for performing error detection on an interleaved signal portion including n successive data bytes in an interleaved order in which the interleaved signal portion was produced by interleaving a coded signal portion including the n data bytes in a non-interleaved order, the n data bytes being made up of information data bytes of a digital information signal portion and at least one error detection data byte;

de-interleaving means for de-interleaving the interleaved signal portion to produce a corresponding de-interleaved signal portion having the data bytes in the non-interleaved order; and receiving means for (a) receiving the interleaved signal portion, and (b) simultaneously supplying the interleaved signal portion to said error detector means and said de-interleaving means.

21. The receiver as claimed in claim 20, wherein the at least one error detection data byte is a CRC error detection data byte.

22. The receiver as claimed in claim 20, wherein said error detection means is adapted to generate an error signal when an error is detected in the interleaved signal portion.

23. The receiver as claimed in claim 20, further comprising further processing means for performing error correction on the de-interleaved signal portion when an error is detected in the interleaved signal portion by said error detector means.

24. The receiver as claimed in claim 20, wherein said error detection means comprises a plurality of error detectors which each individually perform error detection on the interleaved signal portion, and each of the error detectors employs use of a different constant corresponding to a primitive element of a Galois field.

25. The receiver as claimed in claim 24, wherein each of said error detectors is adapted to generate an error signal if an error is detected in the interleaved signal portion by that error detector.

26. The receiver as claimed in claim 20, wherein the coded signal portion was interleaved using m-byte interleaving, and said error detector means includes:

m syndrome generators adapted to produce, on the basis of the n data bytes, m partial syndromes;

feeder means for (a) receiving the n data bytes in successive groups of m or less data bytes each, and (b) sequentially supplying the n data bytes to said m syndrome generators so that (i) each of said m syndrome generators is supplied with different ones of the n data bytes and (ii) a jth syndrome generator of the m syndrome generators receives a jth data byte from each of the groups, where j is an integer such that $0 \leq j \leq m$; and generator means for producing, on the basis of the m partial syndromes, a final syndrome indicating whether an error is detected in the interleaved signal portion.

27. A method of decoding an interleaved signal portion including n successive data bytes in an interleaved order in which the interleaved signal portion was produced by interleaving a coded signal portion including the n data bytes in a non-interleaved order, the n data bytes being made up of information data bytes of a digital information signal portion and at least one error detection data byte, the method comprising:

receiving the interleaved signal portion; and simultaneously (a) performing error detection on the interleaved signal portion, and (b) de-interleaving the interleaved signal portion to produce a corresponding de-interleaved signal portion including the n data bytes in the non-interleaved order.

28. The method as claimed in claim 27, wherein the at least one error detection data byte is a CRC error detection data byte.

29. The method as claimed in claim 27, further comprising error correction processing of the de-interleaved signal portion if an error is detected during error detection of the interleaved signal portion.

30. The method as claimed in claim 27, wherein said coded signal portion was interleaved using m-byte interleaving, and said error detection includes:

(a) sequentially receiving the n data bytes in successive groups of m or less data bytes each, and (b) making the n data bytes available in m streams of successive data bytes so that each of the m streams includes different ones of the n data bytes and a jth stream of the m streams includes a jth data byte from each of the groups, where j is an integer such that $0 \leq j \leq m$;

producing m partial syndromes from the m streams; and producing, on the basis of the m partial syndromes, a final syndrome indicating an error has been detected in the interleaved signal portion.

\* \* \* \* \*